(12) United States Patent
Lin et al.

(10) Patent No.: US 11,855,021 B2
(45) Date of Patent: Dec. 26, 2023

(54) SEMICONDUCTOR STRUCTURE WITH THROUGH SUBSTRATE VIAS AND MANUFACTURING METHOD THEREOF

(71) Applicant: Taiwan Semiconductor Manufacturing Company, Ltd., Hsinchu (TW)

(72) Inventors: Yung-Chi Lin, New Taipei (TW); Chen-Hua Yu, Hsinchu (TW); Tsang-Jiuh Wu, Hsinchu (TW); Wen-Chih Chiou, Miaoli County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 173 days.

(21) Appl. No.: 17/364,909

(22) Filed: Jul. 1, 2021

(65) Prior Publication Data

US 2021/0327836 A1  Oct. 21, 2021

Related U.S. Application Data

(63) Continuation of application No. 16/571,212, filed on Sep. 16, 2019, now Pat. No. 11,063,008.

(51) Int. Cl.
*H01L 23/00* (2006.01)
*H01L 23/48* (2006.01)
(Continued)

(52) U.S. Cl.
CPC .......... *H01L 24/06* (2013.01); *H01L 23/3677* (2013.01); *H01L 23/481* (2013.01);
(Continued)

(58) Field of Classification Search
CPC ... H01L 23/481; H01L 24/06; H01L 23/3677; H01L 23/5226; H01L 23/528; H01L 23/535; H01L 24/05; H01L 24/08; H01L 24/80; H01L 25/0657; H01L 25/50; H01L 2224/05025; H01L 2224/06519;
(Continued)

(56) References Cited

U.S. PATENT DOCUMENTS 8,993,380 B2   3/2015   Hou et al.
9,281,254 B2   3/2016   Yu et al.
(Continued)

*Primary Examiner* — John P. Dulka
(74) *Attorney, Agent, or Firm* — JCIPRNET

(57) ABSTRACT

A semiconductor structure and a manufacturing method thereof are provided. The semiconductor structure includes a semiconductor substrate, an interconnection structure, through substrate vias, conductive pillars and dummy conductive pillars. The interconnection structure is disposed at a front side of the semiconductor substrate, and comprises a stack of dielectric layers and interconnection elements spreading in the stack of dielectric layers. The through substrate vias separately penetrate through the semiconductor substrate and the stack of dielectric layers. The conductive pillars are disposed at a front side of the interconnection structure facing away from the semiconductor substrate, and respectively in electrical connection with one of the through substrate vias. The dummy conductive pillars are disposed aside the conductive pillars at the front side of the interconnection structure.

20 Claims, 16 Drawing Sheets

(51) Int. Cl.
*H01L 23/535* (2006.01)
*H01L 23/522* (2006.01)
*H01L 23/528* (2006.01)
*H01L 25/065* (2023.01)
*H01L 25/00* (2006.01)
*H01L 23/367* (2006.01)

(52) U.S. Cl.
CPC ........ *H01L 23/528* (2013.01); *H01L 23/5226* (2013.01); *H01L 23/535* (2013.01); *H01L 24/05* (2013.01); *H01L 24/08* (2013.01); *H01L 24/80* (2013.01); *H01L 25/0657* (2013.01); *H01L 25/50* (2013.01); *H01L 2224/05025* (2013.01); *H01L 2224/06519* (2013.01); *H01L 2224/08146* (2013.01); *H01L 2224/80895* (2013.01); *H01L 2224/80896* (2013.01); *H01L 2225/06524* (2013.01); *H01L 2225/06541* (2013.01); *H01L 2225/06589* (2013.01)

(58) Field of Classification Search
CPC . H01L 2224/08146; H01L 2224/80895; H01L 2224/80896; H01L 2225/06524; H01L 2225/06541; H01L 2225/06589; H01L 2224/02372; H01L 2224/0239; H01L 2224/05024; H01L 2224/05111; H01L 2224/05124; H01L 2224/05147; H01L 2224/05155; H01L 2224/05567; H01L 2224/05571; H01L 2224/05611; H01L 2224/05624; H01L 2224/05647; H01L 2224/08225; H01L 2224/80379; H01L 2221/68327; H01L 2224/05655; H01L 2224/06051; H01L 2224/08145; H01L 2224/09517; H01L 2224/80399; H01L 21/561; H01L 21/568; H01L 21/6835; H01L 23/3128; H01L 23/3135; H01L 23/585; H01L 24/09; H01L 2225/06586; H01L 23/3185; H01L 25/0652; H01L 21/76898; H01L 23/49816; H01L 23/5386; H01L 2924/00014; H01L 2924/013; H01L 2924/01013; H01L 2924/00013; H01L 2924/01029; H01L 2924/05042; H01L 2924/059; H01L 2924/05442; H01L 2924/04642; H01L 2924/01028

See application file for complete search history.

(56) References Cited

U.S. PATENT DOCUMENTS

| | | | |
|---|---|---|---|
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2002/0024132 A1* | 2/2002 | Motsiff | H01L 23/3677 257/713 |
| 2011/0233785 A1* | 9/2011 | Koester | H01L 21/76898 257/E21.585 |
| 2013/0313690 A1* | 11/2013 | Miyazaki | H01L 21/76898 257/621 |
| 2022/0139975 A1* | 5/2022 | Kimura | H01L 27/14625 257/431 |

\* cited by examiner

SEMICONDUCTOR STRUCTURE WITH THROUGH SUBSTRATE VIAS AND MANUFACTURING METHOD THEREOF

CROSS-REFERENCE TO RELATED APPLICATION

This application is a continuation application of and claims the priority benefit of a prior application Ser. No. 16/571,212, filed on Sep. 16, 2019. The entirety of the above-mentioned patent application is hereby incorporated by reference herein and made a part of this specification.

BACKGROUND

In recent years, the semiconductor industry has experienced rapid growth due to continuous improvement in integration density of various electronic components. These continuously scaled electronic components require smaller packages that occupy less area than previous packages. Exemplary types of packages include quad flat pack (QFP), pin grid array (PGA), ball grid array (BGA), flip chips (FC), three dimensional integrated circuits (3DICs), wafer level packages (WLPs) and package on package (PoP) devices. Some 3DICs prepared by stacking semiconductor dies provide improved integration density and other advantages, such as faster speeds and higher bandwidth, because of the decreased length of interconnects between the stacked chips. However, there are quite a few challenges to be handled for the technology of 3DICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
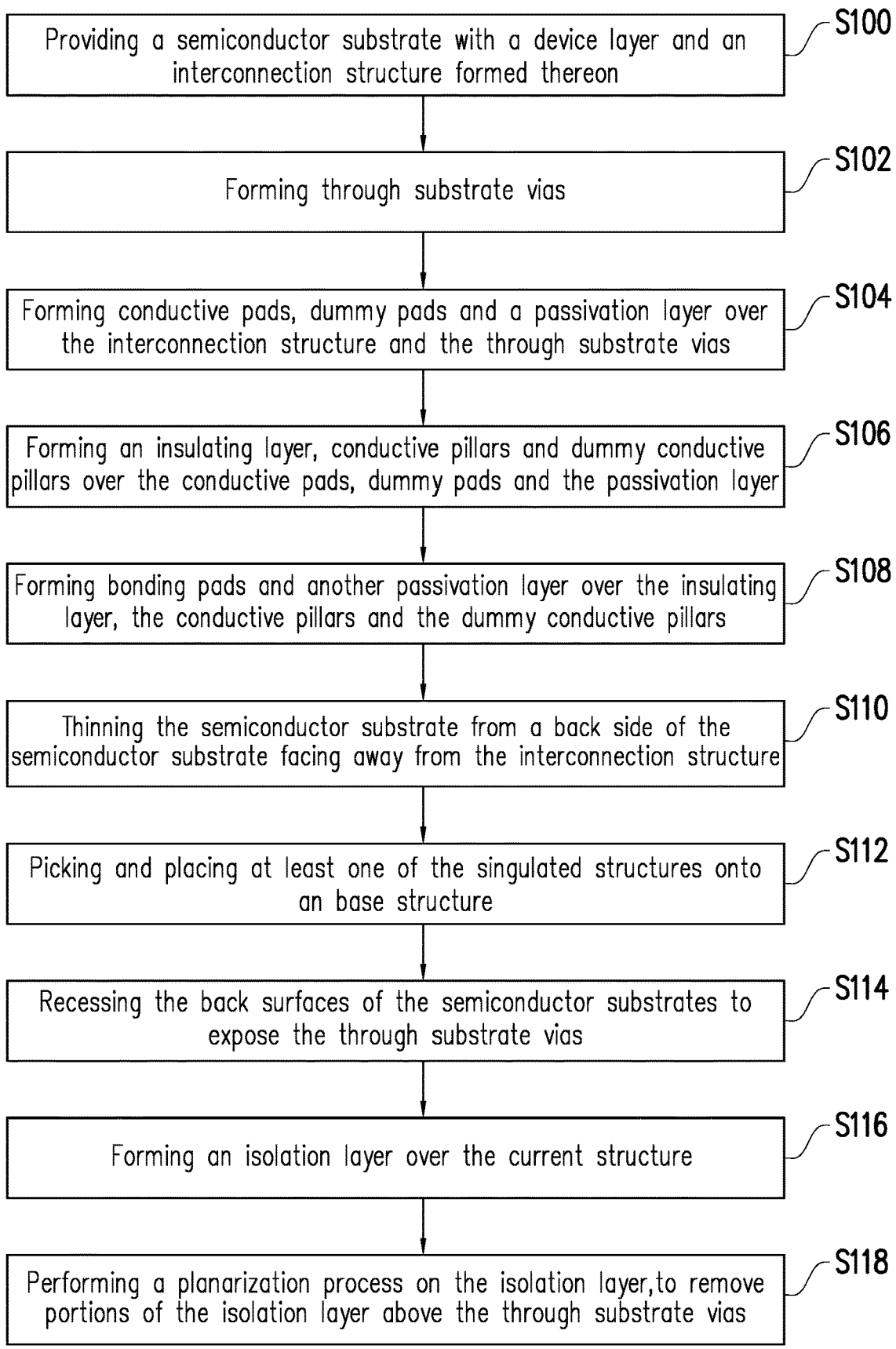
FIG. 1 is a process flow diagram illustrating a manufacturing method of a semiconductor structure according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be appreciated that the following embodiment(s) of the present disclosure provides applicable concepts that can be embodied in a wide variety of specific contexts. The embodiments are intended to provide further explanations but are not used to limit the scope of the present disclosure.

FIG. 1 is a process flow diagram illustrating a manufacturing method of a semiconductor structure according to some embodiments of the present disclosure. FIG. 2A through FIG. 2L are schematic cross-sectional views illustrating structures at various stages of the manufacturing method of the semiconductor structure shown in FIG. 1.

Figure 2A:
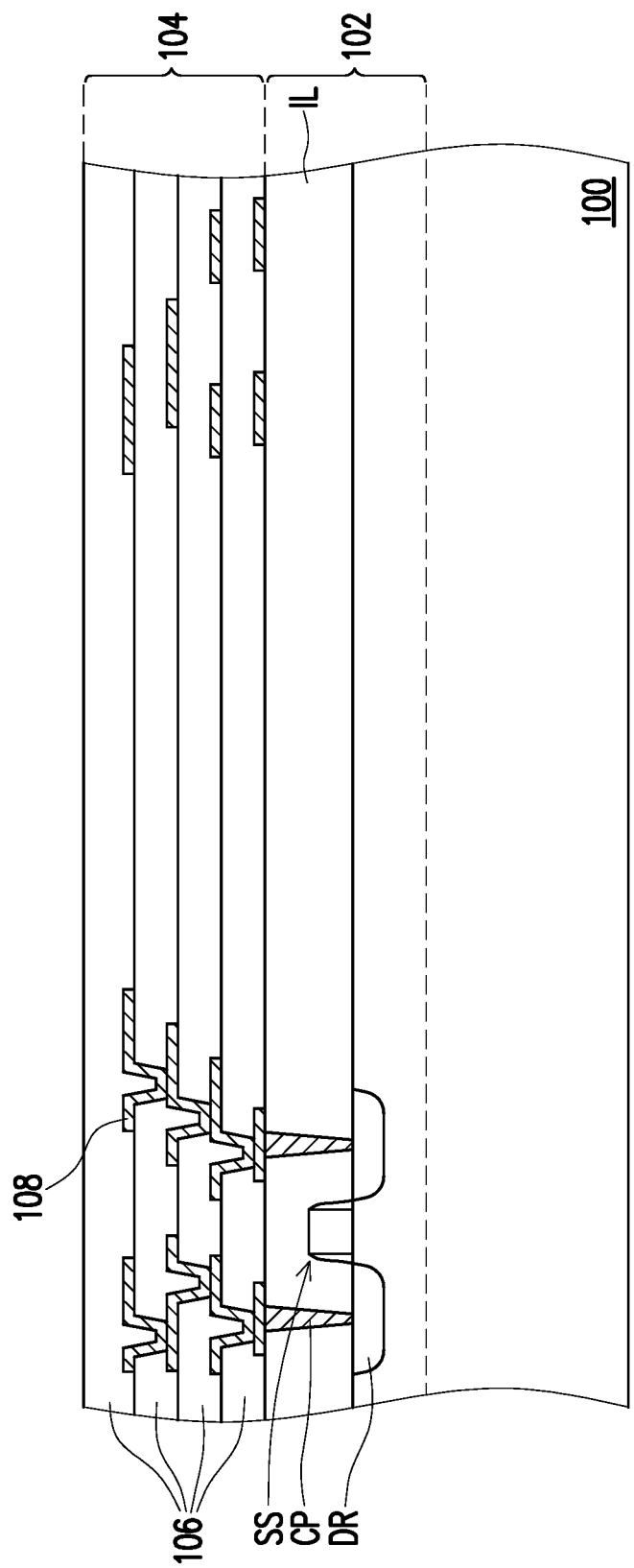
FIG. 2A through FIG. 2L are schematic cross-sectional views illustrating structures at various stages of the manufacturing method of the semiconductor structure shown in FIG. 1.

Referring to FIG. 1 and FIG. 2A, step S100 is performed, and a semiconductor substrate 100 with a device layer 102 and an interconnection structure 104 formed thereon is provided. In some embodiments, the substrate 100 may be a semiconductor wafer or a semiconductor-on-insulator (SOI) wafer. The semiconductor material of the semiconductor wafer or the SOI wafer may include an elemental semiconductor, a semiconductor alloy or a semiconductor compound. For instance, the elemental semiconductor may include Si or Ge. The semiconductor alloy may include SiGe, SiGeC or the like. The semiconductor compound may include SiC, a III-V semiconductor or a II-VI semiconductor. Furthermore, the semiconductor substrate 100 may be doped with a first conductive type or a second conductive type complementary to the first conductive type. For instance, the first conductive type may be N type, whereas the second conductive type may be P type.

The device layer 102 may extend into the semiconductor substrate 100 from above the semiconductor substrate 100. In some embodiments, the device layer 102 includes active devices, passive devices or a combination thereof. For instance, the active devices may include transistors, diodes, the like or combinations thereof, whereas the passive devices may include resistors, capacitors, inductors, the like or combinations thereof. The active devices and the passive devices may include stacking structures SS formed over the semiconductor substrate 100, and may include doped regions DR formed in the semiconductor substrate 100. The stacking structures SS may be, for example, gate structures, and the doped regions DR may respectively have a conductive type the same as or complementary to a conductive type of the semiconductor substrate 100. In addition, the device layer 102 may further include contact plugs CP formed over the semiconductor substrate 100, and may include isolation structures (not shown) formed in or over the semiconductor substrate 100. The contact plugs CP electrically connect the active devices and the passive devices to the interconnection structure 104 formed thereon, whereas the isolation structures, such as shallow trench isolation (STI) structures or deep trench isolation (DTI) structures, are functioned to isolate the active devices and the passive devices from one another. The contact plugs CP and portions of the active devices and/or the passive devices (e.g., the stacking structures SS) over the semiconductor substrate 100 may be formed in an interlayer dielectric layer IL. The active devices and/or the passive devices are covered by the interlayer dielectric layer IL, and the contact plugs CP can be regarded as penetrating through the interlayer dielectric layer IL. In some embodiments, a region of the interlayer dielectric layer IL is substantially free of the active devices, the passive devices and the contact plugs CP, and the through substrate vias 110 formed in the following step (as shown in FIG. 2B) may penetrate through this region of the interlayer dielectric layer IL.

The interconnection structure 104 is formed over the device layer 102, and includes a stack of dielectric layers 106 and interconnection elements 108 formed in the stack of dielectric layers 106. The interconnection elements 108 are electrically connected to the active devices and/or the passive devices in the device layer 102 via, for example, the contact plugs CP. In some embodiments, the interconnection elements 108 respectively include a conductive trace, a conductive via or a combination thereof. The conductive trace horizontally extends on one of the dielectric layers 106 or the device layer 102, whereas the conductive via penetrates one of the dielectric layers 106 and electrically connect to one of the conductive traces. The active devices and/or the passive devices in the device layer 102 along with the interconnection elements 108 in the interconnection structure 104 constitute an integrated circuit. The integrated circuit may be a memory integrated circuit, a logic integrated circuit, an application-specific integrated circuit (ASIC) or the like. In some embodiments, a region of the interconnection structure 104 is substantially free of the interconnection elements 108, and the through substrate vias 110 formed in the following step (as shown in FIG. 2B) may penetrate through this region of the interconnection structure 104.

Figure 2B:
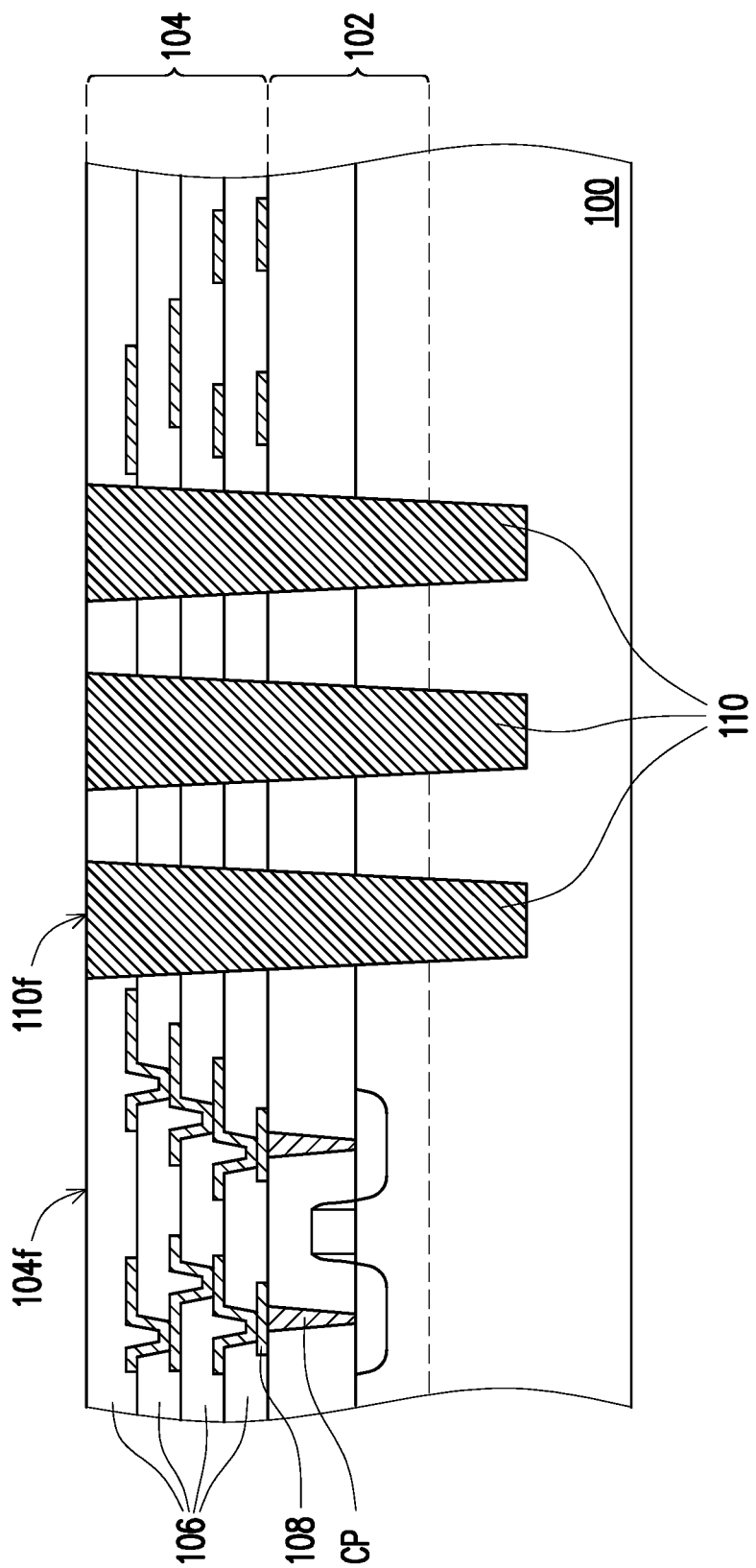

Referring to FIG. 1, FIG. 2A and FIG. 2B, step S102 is performed, and the through substrate vias 110 are formed. The through substrate vias 110 may include signal through substrate via(s), ground through substrate via(s), the like or combinations thereof. Even though 3 through substrate vias 110 are depicted in FIG. 2B, less than 3 or more than 4 through substrate via(s) 110 could be formed. The present disclosure is not limited to an amount of the through substrate vias 110. In some embodiments, the through substrate vias 110 extend along a thickness direction of the current structure from an exposed surface of the interconnection structure 104 (also referred as a front surface 104f) into the semiconductor substrate 100 through the interconnection structure 104 and the device layer 102. In these embodiments, the through substrate vias 110 may be tapered along their extending direction. In addition, the through substrate vias 110 are laterally separated from one another, and may penetrate through the region of the interconnection structure 104 substantially free of the interconnection elements 108 and the region of the interlayer dielectric layer IL substantially free of the active devices, the passive devices and the contact plugs CP. In some embodiments, a terminal (e.g., a bottom terminal) of each through substrate via 110 is currently buried in the semiconductor substrate 100. In other words, in these embodiments, the through substrate vias 110 do not penetrate through the semiconductor substrate 100 in the current step. A material of the through substrate vias 110 may include Cu, Al, Ni, Sn, the like or combinations thereof. A method for forming the through substrate vias 110 may include forming openings that are extending from the front surface 104f of the interconnection structure 104 into the semiconductor substrate 100, and filling a conductive material into these openings to form the through substrate vias 110. In some embodiments, these openings for accommodating the through substrate vias 110 are formed via a drilling process (e.g., a laser drilling process), and the conductive material filled into these opening is formed by a plating process (e.g., an electroplating process or an electroless plating process). The conductive material may initially extend onto the exposed surface of the interconnection structure 104. Thereafter, a planarization process (e.g., a chemical mechanical polishing (CMP) process, a grinding process, an etching process or combinations thereof) may be performed to remove portions of the conductive material above the interconnection structure 104, so as to form the through substrate vias 110 as shown in FIG. 2B. In some embodiments, exposed surfaces of the through substrate vias 110 (also referred as front surfaces 110f of the through substrate vias 110) are substantially coplanar with the front surface 104f of the interconnection structure 104.

Moreover, in some embodiments, at least one lining layer and at least one barrier layer (both not shown) are sequentially formed on a bottom surface and a sidewall of each opening before filling the conductive material into these openings. As such, after forming the through substrate vias 110, a bottom surface and a sidewall of each through substrate via 110 may be covered by the lining layer and the barrier layer (both not shown). A material of the lining layer may be an insulating layer, such as silicon oxide, silicon nitride, the like or combinations thereof, whereas a material of the barrier layer may include Ta, TaN, Ti, TiN, the like or combinations thereof. A method for forming the lining layer may include a deposition process (e.g., a chemical vapor deposition (CVD) process), whereas a method for forming the barrier layer may include a deposition process (e.g., a physical vapor deposition (PVD) process or a CVD process), a plating process (e.g., an electroplating process or an electroless plating process) or a combination thereof. In addition, the through substrate vias 110 described above are formed by a through substrate via last (TSV last) process, since the formation of the through substrate vias 110 follows the formation of the device layer 102 and the interconnection structure 104. However, a TSV middle process or a TSV first process may be alternatively applied (respectively illustrated with reference to FIG. 3A and FIG. 3B in the following paragraphs) for forming the device layer, the interconnection structure and the through substrate vias, the present disclosure is not limited to the sequential order of these steps.

Figure 2C:
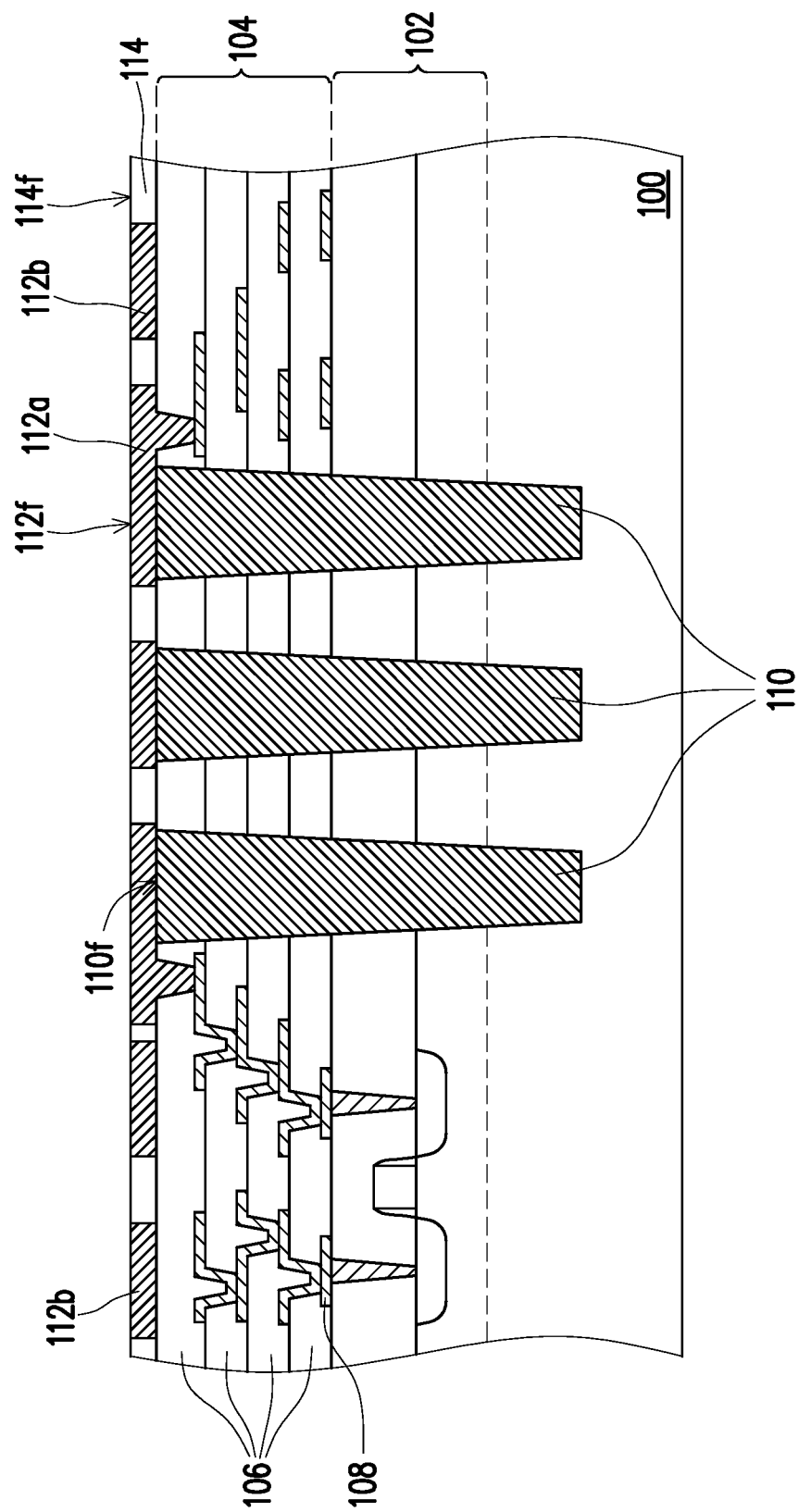

Referring to FIG. 1, FIG. 2B and FIG. 2C, step S104 is performed, and conductive pads 112a, dummy pads 112b and a passivation layer 114 are formed over the interconnection structure 104 and the through substrate vias 110. The conductive pads 112a and the dummy pads 112b can be regarded as being located in the passivation layer 114. The conductive pads 112a are overlapped and electrically connected with the through substrate vias 110, respectively. In addition, at least some of the conductive pads 112a may further extend into the interconnection structure 104, so as to be electrically connected with the interconnection elements 108 in the interconnection structure 104. In some embodiments, substantially the whole front surface 110f of each through substrate via 110 is covered by the overlying conductive pad 112a. In these embodiments, an area of the conductive pad 112*a* may be greater than an area of the front surface 110*f* of the through substrate via 110. On the other hand, the dummy pads 112*b* are not electrically connected to the through substrate vias 110 nor the interconnection structure 104. In some embodiments, the dummy pads 112*b* are electrically floated or grounded. A material of the conductive pads 112*a* and the dummy pads 112*b* may include Al, Cu, Ni, the like or combinations thereof. the like or combinations thereof. A method for forming the conductive pads 112*a* and the dummy pads 112*b* may include removing some portions of the topmost dielectric layer 106 to expose some portions of the interconnection elements 108, and then forming the conductive pads 112*a* and the dummy pads 112*b* by a deposition process (e.g., a PVD process) and/or a plating process (e.g., an electroplating process or an electroless plating process) with patterns defined by a photoresist layer. Thereafter, an insulating material layer may be formed over the interconnection structure 104, the conductive pads 112*a* and the dummy pads 112*b* by a deposition process (e.g. a CVD process) or a solution process (e.g., a spin coating process), and then a planarization process (e.g., a CMP process, a grinding process, an etching process or combinations thereof) may be performed to remove portions of the insulating material layer above the conductive pads 112*a* and the dummy pads 112*b*, so as to form the passivation layer 114 shown in FIG. 2C. Alternatively, the conductive pads 112*a*, the dummy pads 112*b* and the passivation layer 114 may be formed by a damascene process. In these alternative embodiments, an insulating material layer is globally formed over the interconnection structure 104 and the through substrate vias 110, and openings are formed in this insulating material layer, so as to form the passivation layer 114 shown in FIG. 2C. Thereafter, the conductive pads 112*a* and the dummy pads 112*b* are formed in these openings by a deposition process and/or a plating process, along with a planarization process. In some embodiments, exposed surfaces of the conductive pads 112*a* and the dummy pads 112*b* (also referred as front surfaces 112*f* of the conductive pads 112*a* and the dummy pads 112*b*) are substantially coplanar with an exposed surface of the passivation layer 114 (also referred as a front surface 114*f* of the passivation layer 114). A material of the passivation layer 114 may include silicon nitride, silicon oxide, the like or combinations thereof.

Figure 2D:
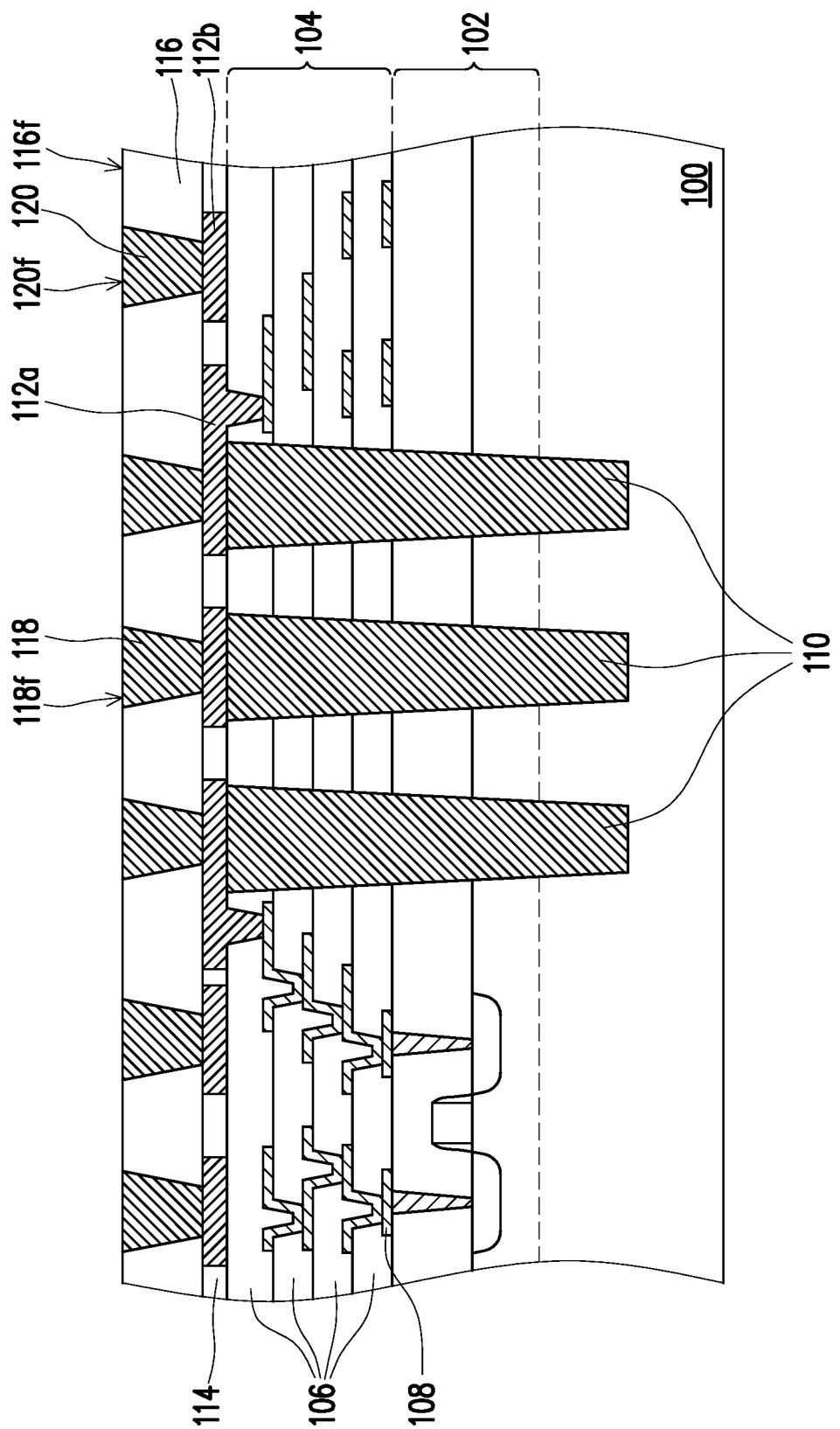

Referring to FIG. 1, FIG. 2C and FIG. 2D, step S106 is performed, and an insulating layer 116, conductive pillars 118 and dummy conductive pillars 120 are formed over the conductive pads 112*a*, the dummy pads 112*b* and the passivation layer 114. The conductive pillars 118 and the dummy conductive pillars 120 can be regarded as being located in the insulating layer 116. The conductive pillars 118 are overlapped and electrically connected with the conductive pads 112*a*, respectively. The dummy conductive pillars 120 are located aside the conductive pillars 118, and may be laterally separated from one another. The dummy conductive pillars 120 may be overlapped and in contact with the dummy pads 112*b*, but may not be electrically connected to the conductive pillars 118, the conductive pads 112*a*, the through substrate vias 110 nor the interconnection structure 104. In some embodiments, both of the dummy pads 112*b* and the dummy conductive pillars 120 may be electrically floated or grounded. In addition, in some embodiments, exposed surfaces of the conductive pillars 118 (also referred as front surfaces 118*0*, exposed surfaces of the dummy conductive pillars 120 (also referred as front surfaces 120*0* are substantially coplanar with an exposed surface of the insulating layer 116 (also referred as a front surface 1160. A material of the conductive pillars 118 and the dummy conductive pillars 120 may include Cu, Al, Ni, Sn, the like or combinations thereof, whereas a material of the insulating layer 116 may include silicon oxide, silicon nitride, silicon oxynitride, silicon carbonitride, the like or combinations thereof. In some embodiments, the insulating layer 116, the conductive pillars 118 and the dummy conductive pillars 120 may be formed by a damascene process. In these embodiments, an insulating material layer may be initially formed over the conductive pads 112*a*, the dummy pads 112*b* and the passivation layer 114 by a deposition process (e.g., a CVD process) or a solution process (e.g., a spin coating process), then openings are formed in this insulating material layer to form the insulating layer 116 as shown in FIG. 2D. Thereafter, the conductive pillars 118 and the dummy conductive pillars 120 are formed in these openings by a plating process (e.g., an electroplating process or an electroless plating process) and/or a deposition process (e.g., a PVD process), along with a planarization process (e.g., a CMP process, a grinding process, an etching process or combinations thereof). In alternative embodiments, the conductive pillars 118 and the dummy conductive pillars 120 may be formed before forming the insulating layer 116. In these alternative embodiments, the conductive pillars 118 and the dummy conductive pillars 120 may be formed by a deposition process and/or a plating process with patterns defined by a photoresist layer. Subsequently, an insulating material layer is globally formed over the current structure. Thereafter, a planarization process may be performed to remove portions of the insulating material layer above the conductive pillars 118 and the dummy conductive pillars 120, so as to form the insulating layer 116 as shown in FIG. 2D. In some embodiments, an aspect ratio (i.e., a ratio of height with respect to width) of the conductive pillars 118 and the dummy conductive pillars 120 may be greater than an aspect ratio of the conductive pads 112*a*, an aspect ratio of the dummy pads 112*b* and an aspect ratio of the bonding pads 122 formed in the following step (shown in FIG. 2E), but less than an aspect ratio of the through substrate vias 110.

Figure 2E:
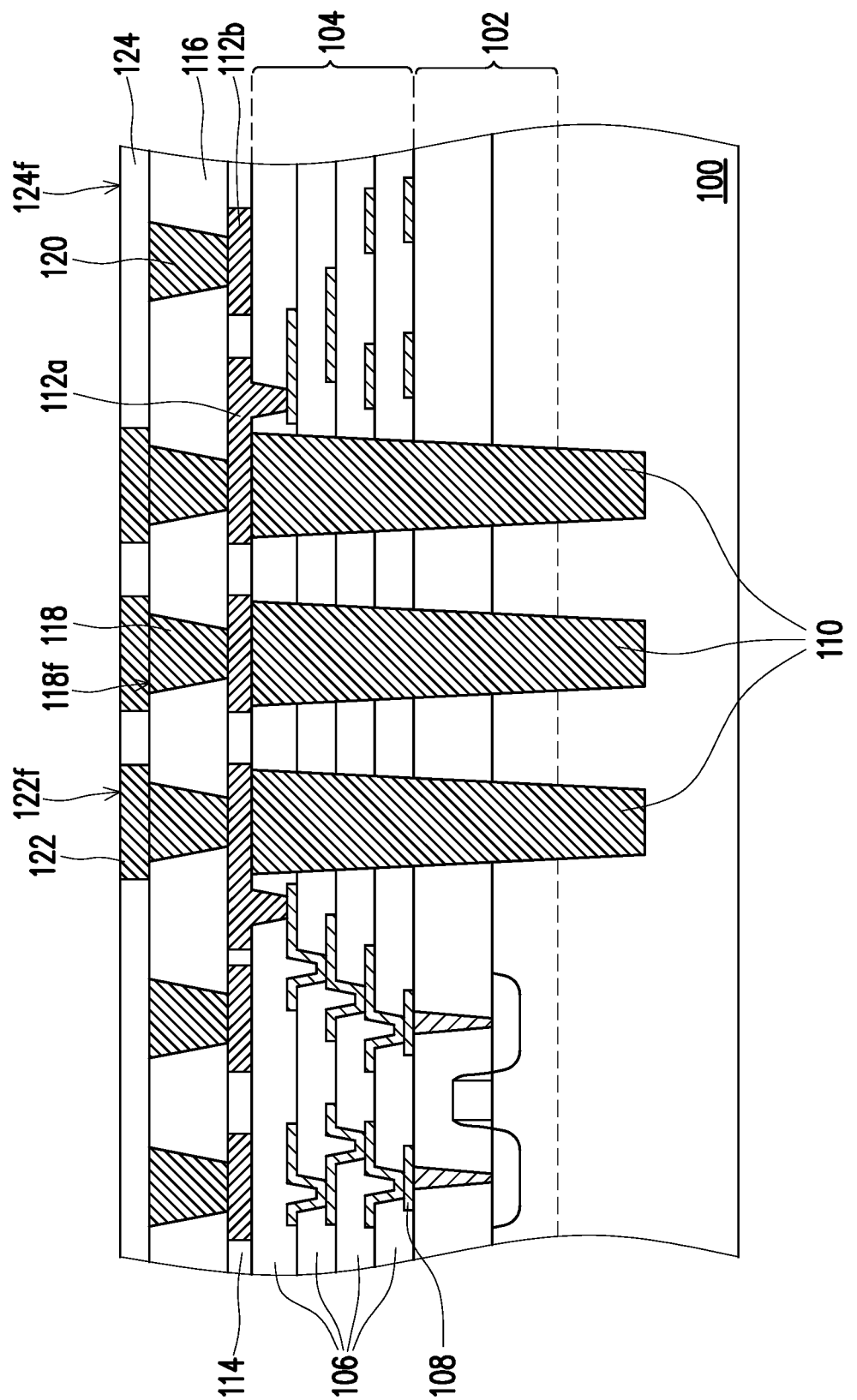

Referring to FIG. 1, FIG. 2D and FIG. 2E, step S108 is performed, and bonding pads 122 and a passivation layer 124 are formed over the insulating layer 116, the conductive pillars 118 and the dummy conductive pillars 120. The bonding pads 122 can be regarded as being located in the passivation layer 124. In addition, the bonding pads 122 are overlapped and electrically connected with the conductive pillars 118, respectively. In some embodiments, substantially the whole front surface 118*f* of each conductive pillar 118 is covered by the overlying bonding pad 122. In these embodiments, an area of each bonding pad 122 may be greater than an area of the conductive pillar 118. On the other hand, the dummy conductive pillars 120 are covered by the passivation layer 124, rather than being overlapped with the bonding pads 122. Accordingly, a stacking structure including the dummy pads 112*b* and the dummy conductive pillars 120 may be respectively wrapped by the topmost dielectric layer 106, the passivation layer 114, the insulating layer 116 and the passivation layer 124, and may not be electrically connected to the interconnection structure 104, the through substrate vias 110, the conductive pads 112*a* and the bonding pads 122. In some embodiments, exposed surfaces of the bonding pads 122 (also referred as front surfaces 122*f*) are substantially coplanar with an exposed surface of the passivation layer 124 (also referred as a front surface 124*f*. A material of the bonding pads 122 may include Cu, Al, Ni, Sn, the like or combinations thereof, whereas a material of the passivation layer 124 may include silicon oxide, silicon nitride, silicon oxynitride, silicon carbonitride, the like or a combination thereof. In some embodiments, the bonding pads 122 and the passivation layer 124 may be formed by a damascene process. In these embodiments, an insulating material layer may be initially formed over the insulating layer 116, the conductive pillars 118 and the dummy conductive pillars 120 by a deposition process (e.g., a CVD process) or a solution process (e.g., a spin coating process), then openings are formed in this insulating material layer by a lithography process and an etching process, to form the passivation layer 124 as shown in FIG. 2E. Thereafter, the bonding pads 122 are formed in these openings by a plating process (e.g., an electroplating process or an electroless plating process), a deposition process (e.g., a PVD process) or a combination thereof, along with a planarization process (e.g., a CMP process, a grinding process, an etching process or combinations thereof). In alternative embodiments, the bonding pads 122 may be formed before forming the passivation layer 124. In these alternative embodiments, the bonding pads 122 are formed over the conductive pillars 118 by a deposition process and/or a plating process with patterns defined by a photoresist layer, then an insulating material layer is globally formed over the current structure. Thereafter, a planarization process may be performed to remove portions of the insulating material layer above the bonding pads 122, so as to form the passivation layer 124 as shown in FIG. 2E.

Figure 2F:
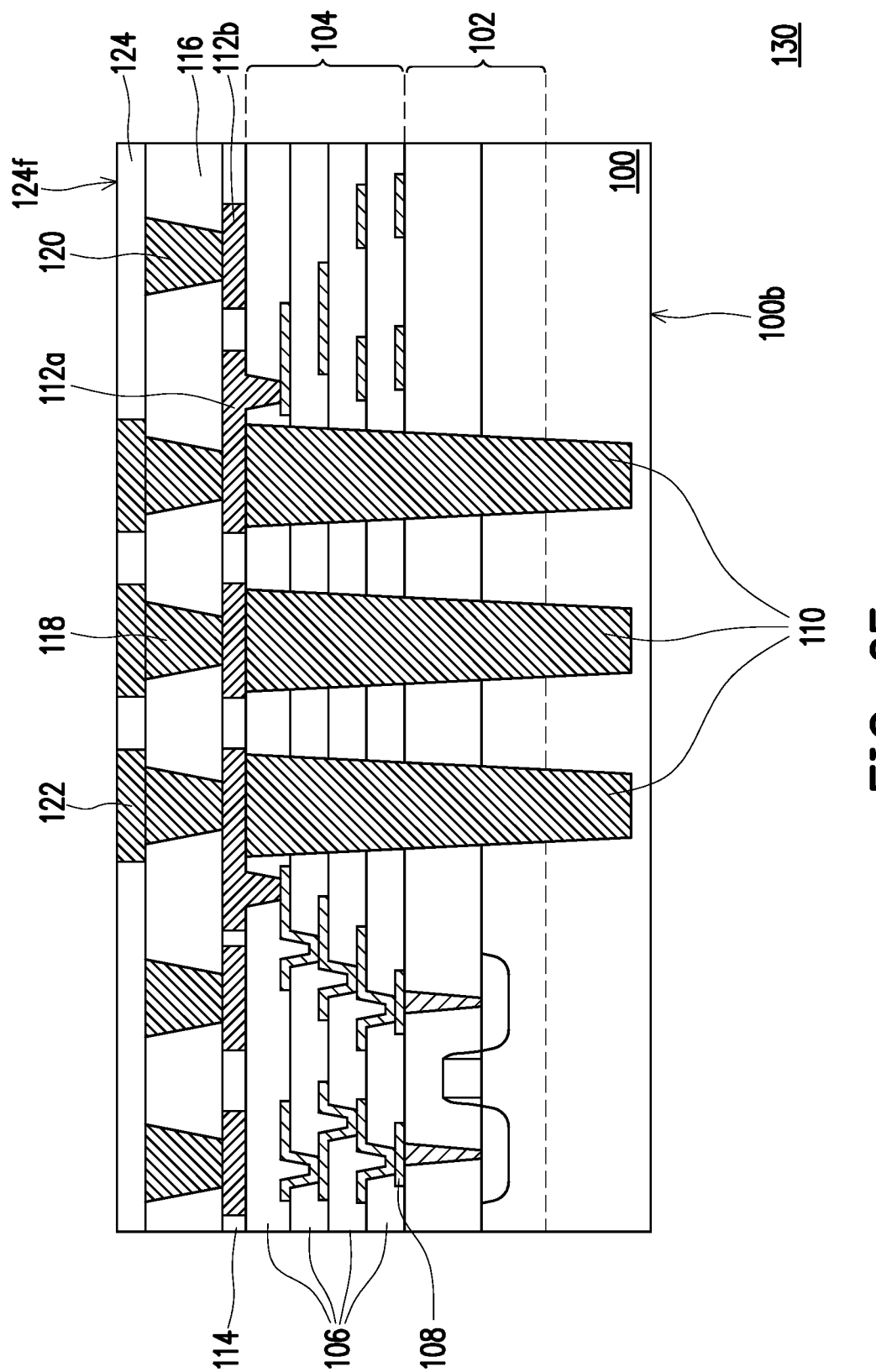

Referring to FIG. 1, FIG. 2E and FIG. 2F, step S110 is performed, and the semiconductor substrate 100 is thinned from a back side of the semiconductor substrate 100 that is facing away from the interconnection structure 104. In some embodiments, the terminals (e.g., the bottom terminals) of the through substrate vias 110 are still buried in the semiconductor substrate 100, except that a distance between the terminals of the through substrate vias 110 and a back surface 100b of the semiconductor substrate 100 is shortened after the thinning process. In alternative embodiments, the through substrate vias 110 are exposed after performing the thinning process on the semiconductor substrate 100. For instance, a total thickness of the current structure measured from the back surface 100b of the semiconductor substrate 100 to the front surface 124f of the passivation layer 124 may range from 10 um to 775 um. The thinning process may include a CMP process, a grinding process, an etching process or combinations thereof, and the passivation layer 124 and the bonding pads 122 may be attached to a tape or a carrier (not shown) before performing the thinning process. Furthermore, after performing the thinning process, the current wafer structure may be subjected to a singulation process. One of the singulated structures 130 exemplarily depicted in FIG. 2F includes at least one of the through substrate vias 110 and the overlying conductive pad 112a, conductive pillar 118 and bonding pad 122, and also includes at least one of the dummy pads 112b and the overlying dummy conductive pillar 120. The singulation process may include a dicing process, a sawing process, a laser ablation process, an etching process or combinations thereof.

Figure 2G:
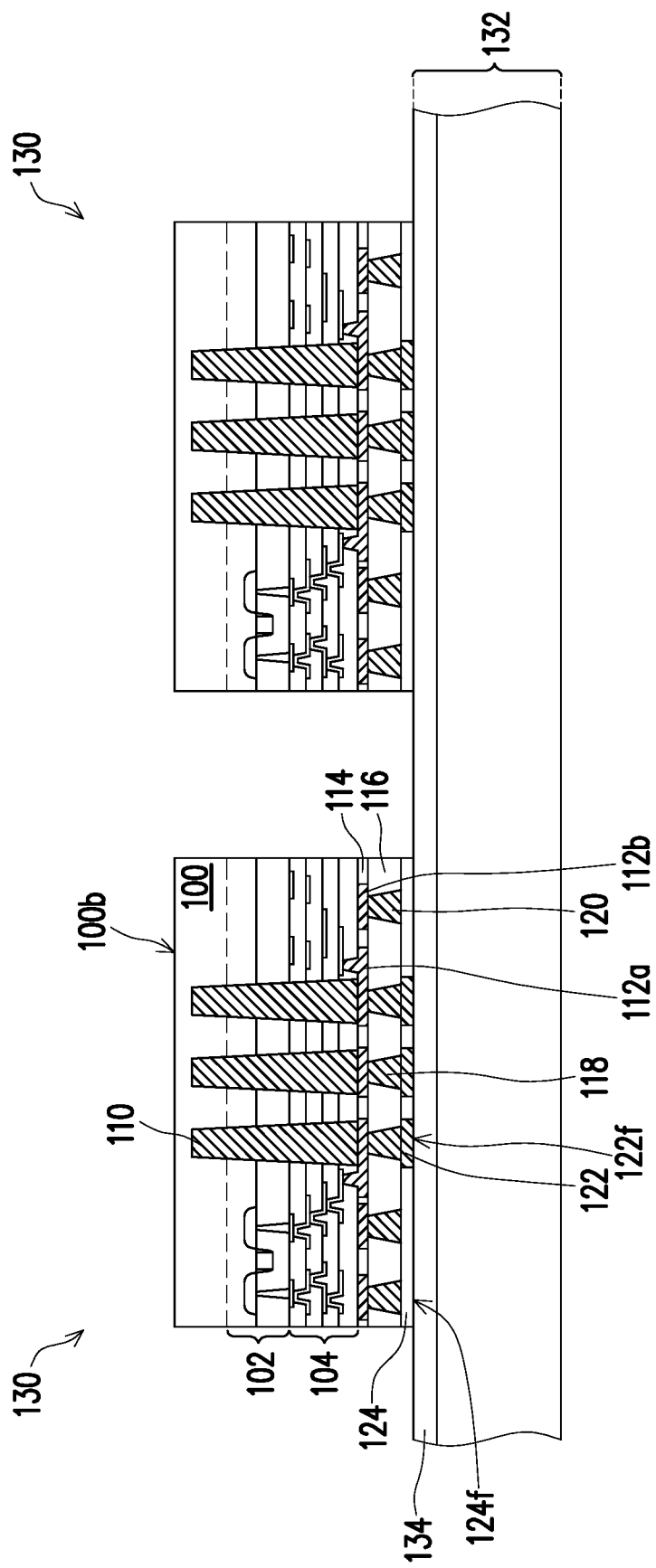

Referring to FIG. 1, FIG. 2F and FIG. 2G, step S112 is performed, and at least one of the singulated structures 130 (e.g., 2 of the singulated structures 130) is picked and placed onto an base structure 132. In some embodiments, the base structure 132 is a device die (e.g., a logic die), and has integrated circuits formed therein (not shown). In these embodiments, an active side of the device die may be attached with the singulated structures 130, whereas a back side of the device die may face away from the attached singulated structures 130. Alternatively, the back side of the device die may be attached with the singulated structures 130, whereas the active side of the device die may face away from the attached singulated structures 130. In addition, through substrate vias (not shown), which is similar to the through substrate vias 110, may be formed in the device die for realizing communication between the active side and the back side of the device die. The active side of the device die is referred as a side of the device die at which integrated circuits are formed, whereas the back side of the device die is referred as another side of the device die away from the integrated circuits. In some embodiments, the base structure 132 has a dielectric layer 134 exposed at its surface, on which the singulated structures 130 to be attached. Although not depicted, bonding pads may be disposed in the dielectric layer 134 and may be exposed at the to-be-attached surface of the base structure 132. In some embodiments, the singulated structure 130 shown in FIG. 2F is flipped over and attached onto the base structure 132. In these embodiments, the singulated structure 130 may be attached onto the base structure 132 via the front surface 124f of the passivation layer 124 and the front surfaces 122f of the bonding pads 122. On the other hand, the back surface 100b of the semiconductor substrate 100 is exposed, and facing away from the base structure 132. In some embodiments, each of the singulated structures 130 is attached onto the base structure 132 by a hybrid bonding manner. In these embodiments, the passivation layers 124 of the singulated structures 130 are bonded with the dielectric layer 134 of the base structure 132, whereas the bonding pads 122 of the singulated structures 130 are bonded with the bonding pads (not shown) in the dielectric layer 134 of the base structure 132. For instance, the hybrid bonding between the singulated structures 130 and the base structure 132 is carried out by an annealing process performed after placing the singulated structures 130 onto the base structure 132. Since the front surfaces 120f of the dummy conductive pillars 120 facing toward the base structure 132 are covered by the passivation layer 124, the dummy conductive pillars 120 are not in direct contact with the base structure 132, but separated from the base structure 132 by the passivation layer 124. Thereby, the dummy conductive pillars 120 may be electrically isolated from the base structure 132.

In alternative embodiments, the base structure 132 is a carrier (e.g., a glass carrier), and the dielectric layer 134 at a surface of the base structure 132 may be a release layer (e.g., a thermal release layer or a light-to-heat-conversion (LTHC) release layer).

Figure 2H:
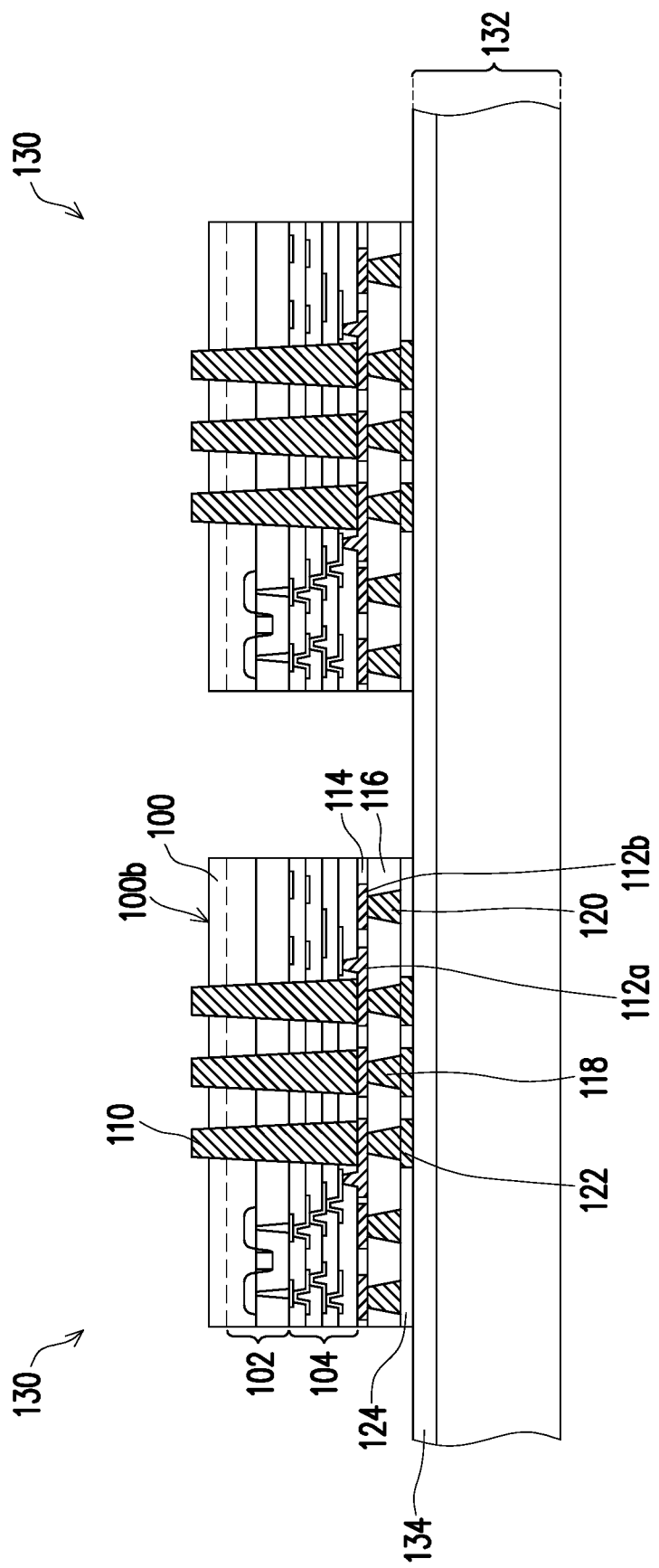

Referring to FIG. 1, FIG. 2G and FIG. 2H, step S114 is performed, and the back surfaces 100b of the semiconductor substrates 100 are recessed to expose the through substrate vias 110. Currently, the through substrate vias 110 can be regarded as penetrating through the semiconductor substrate 100. In some embodiments, the through substrate vias 110 are protruded from the recessed back surfaces 100b of the semiconductor substrates 100. For instance, the through substrate vias 110 may be protruded from the back surfaces 100b of the semiconductor substrates 100 by a height ranging from 100 Å to 30 kÅ. A method for recessing the back surfaces 100b of the semiconductor substrates 100 may include an etching process (e.g., an isotropic etching process or an anisotropic etching process), and a depth of the removed portions of the semiconductor substrates 100 may be adjusted by a process time of the etching process.

Figure 2I:
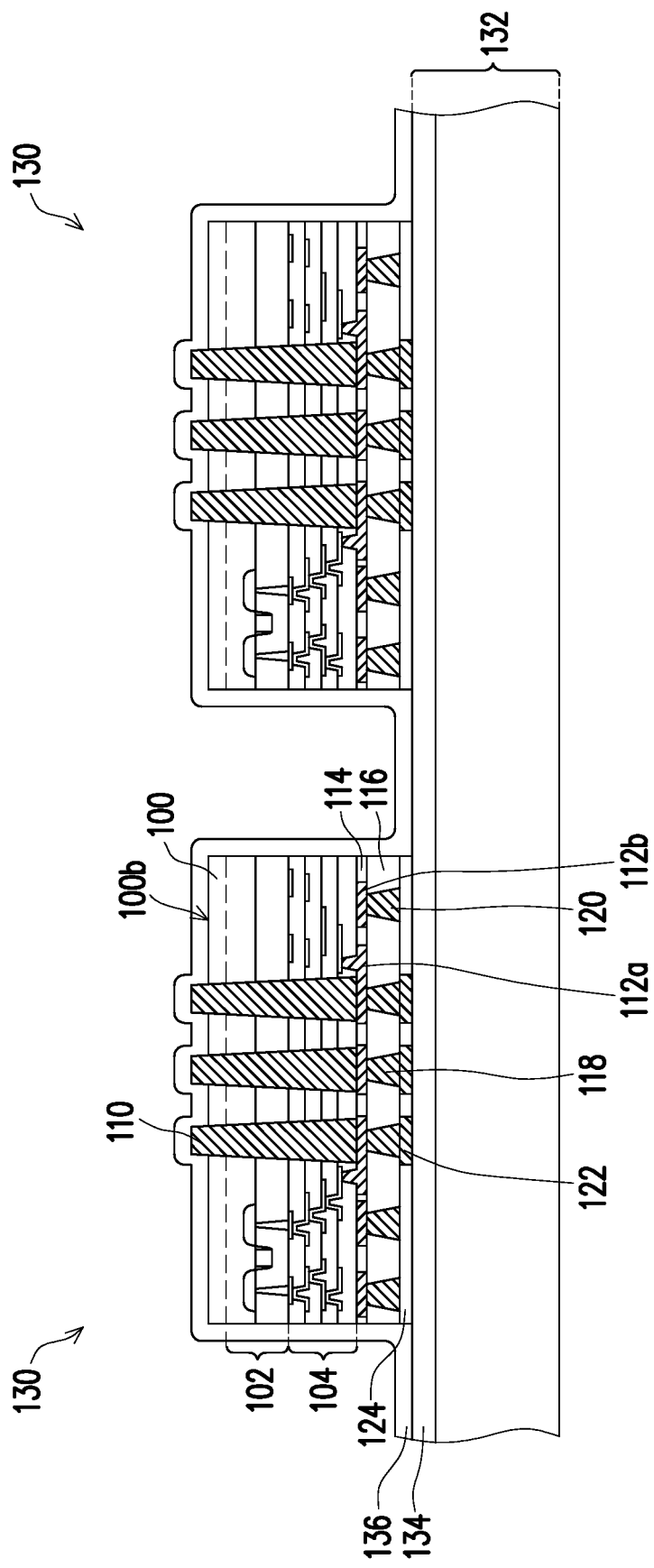

Referring to FIG. 1, FIG. 2H and FIG. 2I, step S116 is performed, and an isolation layer 136 is formed over the structure shown in FIG. 2H. As such, a surface of the dielectric layer 134, sidewalls of the singulated structures 130 and top surfaces of the singulated structures 130 (including the back surfaces 100b of the semiconductor substrates 100 and the exposed surfaces of the through substrate vias 110) are covered by the isolation layer 136. A material of the isolation layer 136 may include silicon nitride, silicon oxide or other insulating materials. A method for forming the isolation layer 136 may include a deposition process (e.g., a chemical vapor deposition process) or a solution process (e.g., a spin coating process).

Figure 2J:
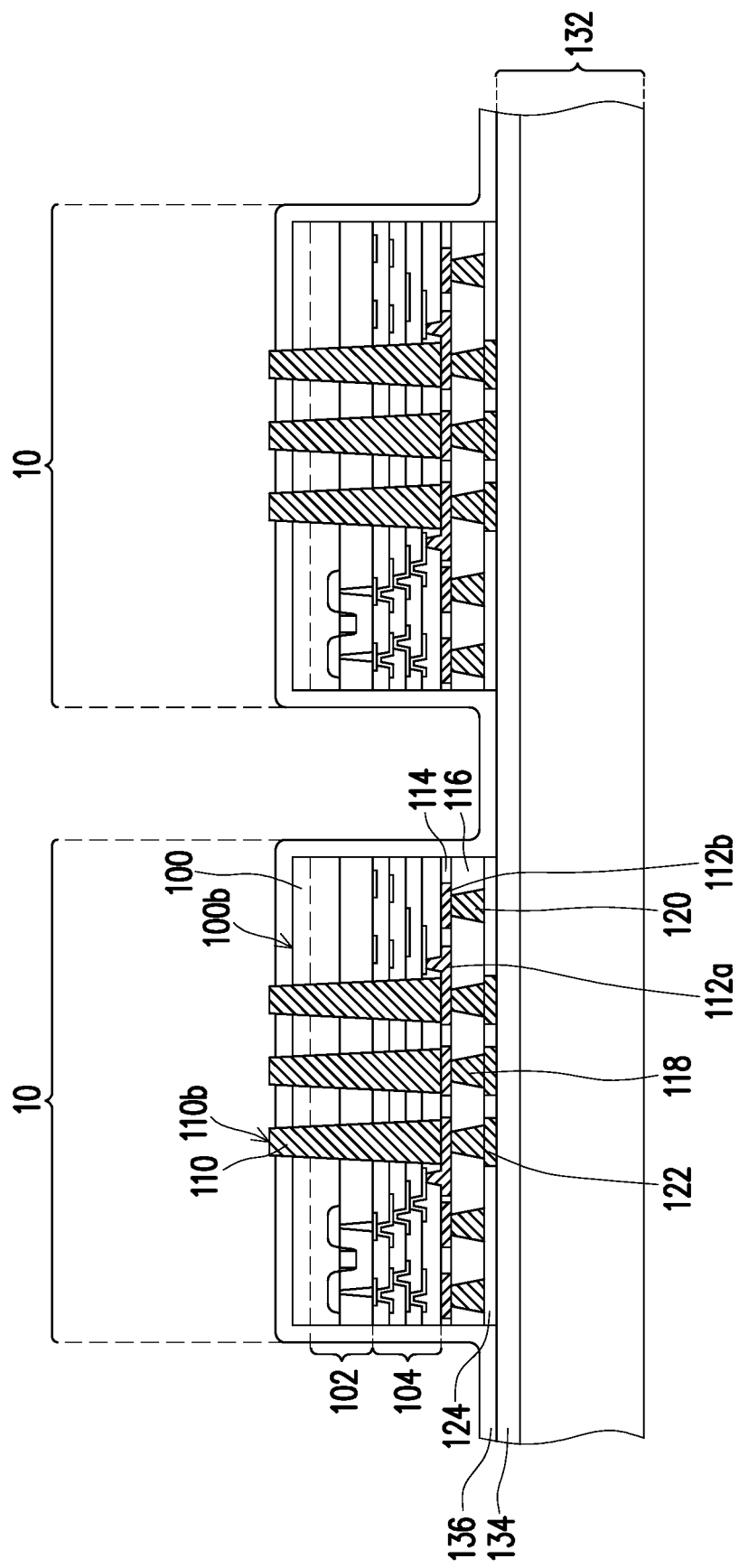
Figure 2K:
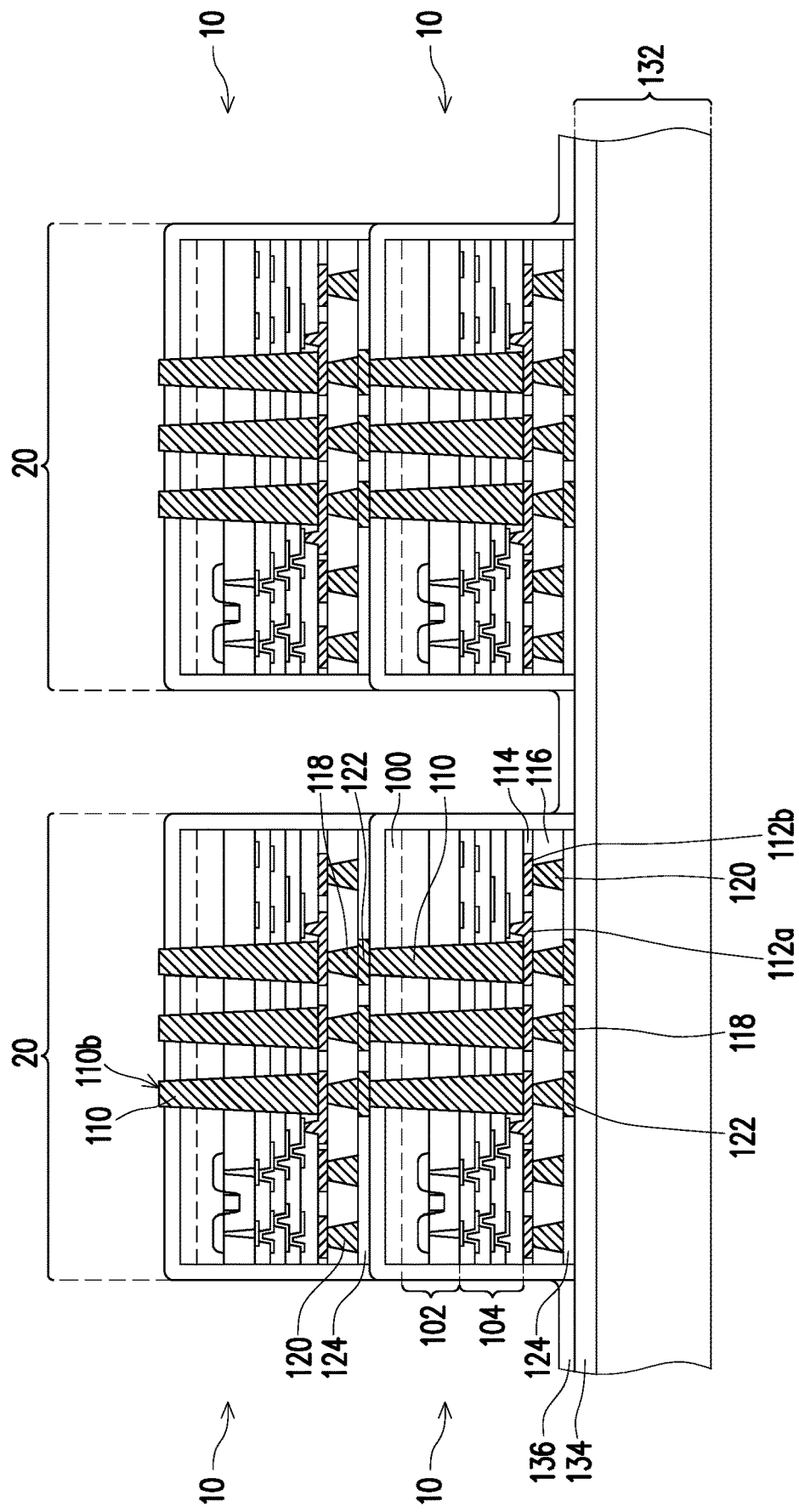

Referring to FIG. 1, FIG. 2I and FIG. 2J, step S118 is performed, and a planarization process is performed on the isolation layer 136, so as to remove portions of the isolation layer 136 above the through substrate vias 110. In this way, the through substrate vias 110 are exposed. In some embodiments, back surfaces 110b of the through substrate vias 110 are slightly protruded from the isolation layer 136. In some embodiments, the planarization process includes a CMP process, a grinding process, an etching process or combinations thereof. Up to here, semiconductor structures 10 respectively including one of the singulated structures 130 (as labeled in FIG. 2I) and a portion of the isolation layer 136 covered thereon are formed over the base structure 132. The semiconductor structures 10 may be regarded as semiconductor dies, such as memory dies, logic dies, ASIC dies or the like.

Referring to FIG. 1 and FIG. 2H through FIG. 2K, in some embodiments, steps S112 through S116 (as shown in FIG. 2H through FIG. 2J) are repeated, and semiconductor structures 20 (shown in FIG. 2K) respectively including a stack of the semiconductor structures 10 are formed over the base structure 132. The semiconductor structures 20 may be respectively regarded as a die stack, and may be packaged along with the base structure 132 and another semiconductor device in a final package structure, or may be detached from the base structure 132 and packaged with another semiconductor device in a final package structure. In one of the semiconductor structures 20, the bonding pads 122 of the upper semiconductor structure 10 are facing toward and bonded with the back surfaces 110b (as labeled in FIG. 2J) of the through substrate vias 110 in the lower semiconductor structure 10, so as to be electrically connected with the through substrate vias 110 of the lower semiconductor structure 10. Therefore, the conductive pillars 118 of the upper semiconductor structure 10 could be electrically connected to the lower semiconductor structure 10 via the bonding pads 122. In some embodiments, the previously protruded portions of the through substrate vias 110 of the lower semiconductor structure 10 is compressed by the upper semiconductor structure 10, and may be no longer protruded from the surrounding isolation layer 136. On the other hand, the dummy conductive pillars 120 of the upper semiconductor structure 10 are vertically separated from the lower semiconductor structure 10 by the passivation layer 124, thus are electrically isolated from the lower semiconductor structure 10. In addition, as a result of the connection manner of the semiconductor structures 10 in the same semiconductor structure 20, the back surfaces 110b of the through substrate vias 110 in the semiconductor structure 20 are all facing away from the base structure 132, whereas the front surfaces 122f of the bonding pads 122 in the semiconductor structure 20 are all facing toward the base structure 132. In some embodiments, the semiconductor structures 10 in the same semiconductor structure 20 are bonded with one another by a hybrid bonding manner. As such, the passivation layer 124 of the upper semiconductor structure 10 is bonded with the isolation layer 136 of the lower semiconductor structure 10, whereas the bonding pads 122 of the upper semiconductor structure 10 are bonded with the through substrate vias 110 of the lower semiconductor structure 10. In these embodiments, a plurality of annealing processes may be respectively performed after placing each of the semiconductor structures 10 on the base structure 132. Alternatively, a single annealing process may be performed after all of the semiconductor structures 10 are placed on the base structure 132.

Furthermore, in some embodiments, the isolation layer 136 formed along with the lower semiconductor structures 10 may be partially removed when the upper semiconductor structures 10 are subjected to the recessing of the semiconductor substrates 100. The portion of the isolation layer 136 formed along with the lower semiconductor structures 10 used to surround the lower semiconductor structures 10 is removed, whereas other portions of this isolation layer 136 covering the lower semiconductor structures 10 are remained. Therefore, a portion of the base structure 132 surrounding the lower semiconductor structures 10 is exposed during the step of recessing the semiconductor substrate 100 of the upper semiconductor structure 10. Subsequently, this portion of the base structure 132 is once again covered after the formation of the isolation layer 136 formed along with the upper semiconductor structures 10.

Figure 2L:
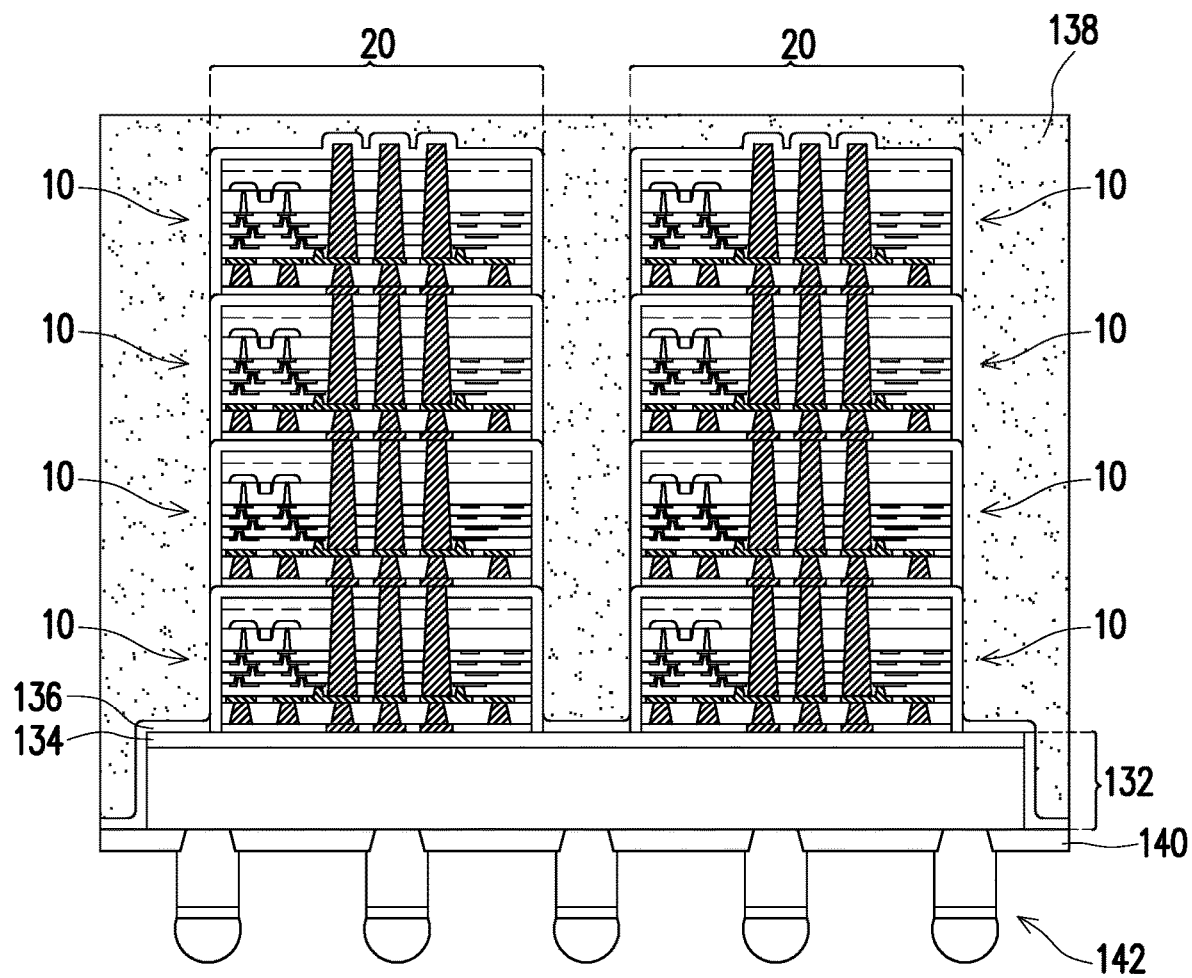

Referring to FIG. 2L, in some embodiments, the step S112 through S118 (as shown in FIG. 2H through FIG. 2J) are repeated more than once, and each of the semiconductor structures 20 may have more than 3 semiconductor structures 10 (e.g., 4 semiconductor structures 10 as shown in FIG. 2L). In some embodiments, during the processing of the topmost semiconductor substrate 10 in each semiconductor structure 20, the step S118 (performing planarization process on the isolation layer 136) may be skipped. In these embodiments, the back surfaces 110b of the through substrate vias 110 in the topmost semiconductor structure 10 is covered by the isolation layer 136. In other embodiments, the topmost semiconductor structure 10 does not have the through substrate vias 110. Furthermore, the semiconductor structures 20 and the base structure 132 may be encapsulated by an encapsulant 138. In addition, a protection layer 140 may be formed at a bottom surface of the encapsulant 138 and a bottom surface of the base structure 132. In those embodiments where the base structure 132 is a device die, the bottom surface of the base structure 132 may be the active side of the device die. Alternatively, the bottom surface of the base structure 132 may be the back side of the device die. The protection layer 140 has openings respectively expose a portion of the base structure 132, and electrical connectors 142 may be respectively disposed in these openings of the protection layer 140, so as to be electrically connected to the base structure 132. The electrical connectors 142 may include micro-bumps, controlled collapse chip connection (C4) bumps, ball grid array (BGA) balls, solder balls or the like. Moreover, although it is not depicted, the current structure as shown in FIG. 2L may be further attached onto a circuit board or a package substrate.

In summary, the semiconductor structure 20 according to embodiments in the present disclosure includes a stack of the semiconductor structures 10. The semiconductor structure 10 has the through substrate vias 110 extending to a back side of the semiconductor structure 10, and has the conductive pillars 118 and the bonding pads 120 formed at a front side of the semiconductor structure 10 for interconnecting between the through substrate vias 110 and another one of the semiconductor structures 10 (or a pre-provided base structure 132). As compared to forming electrical connectors (e.g., micro-bumps or the like) at opposite sides of a semiconductor die for interconnecting with other semiconductor dies, the conductive pillars 118 and the bonding pads 122 of the embodiments in the present disclosure are formed at a single side of the semiconductor structure 10. In this way, several process steps including, for example, flipping over a wafer structure and attaching the wafer structure to an additional carrier are no longer required, and formation of the conductive pillars 118 and the bonding pads 122 can be integrated with a back-end-of-line (BEOL) process of the semiconductor structure 10. In this way, a manufacturing cost of the semiconductor structure 10 can be reduced. Moreover, in some embodiments, the dummy pads 112b and the dummy conductive pillars 120 are formed along with the conductive pads 112a and the conductive pillars 118 at the front side of the semiconductor structure 10. The dummy pads 112b are overlapped and in contact with the dummy conductive pillars 120, respectively. The dummy pads 112b are similar to the conductive pads 112a, except that the dummy pads 112b may not participate in signal transmitting. Similarly, the dummy conductive pillars 120 are similar to the conductive pillars 118, except that the dummy conductive pillars 120 may not participate in signal transmitting. By disposing the dummy pads 112b and the dummy conductive pillars 120, a volume ratio of a high thermal conductivity material (e.g., the conductive pillars 118, the dummy conductive pillars 120 and the bonding pads 122) with respect to a low thermal conductivity material (e.g., the insulating layer 116 and the passivation layer 124) at a surface region of the semiconductor structure 10 can be significantly increased, and a thermal resistance of the semiconductor structure 10 or the semiconductor structure 20 can be effectively lowered. For instance, the thermal resistance of the semiconductor structure 20 may be lowered to about 4.19° C.-mm$^2$/W or less.

Figure 3A:
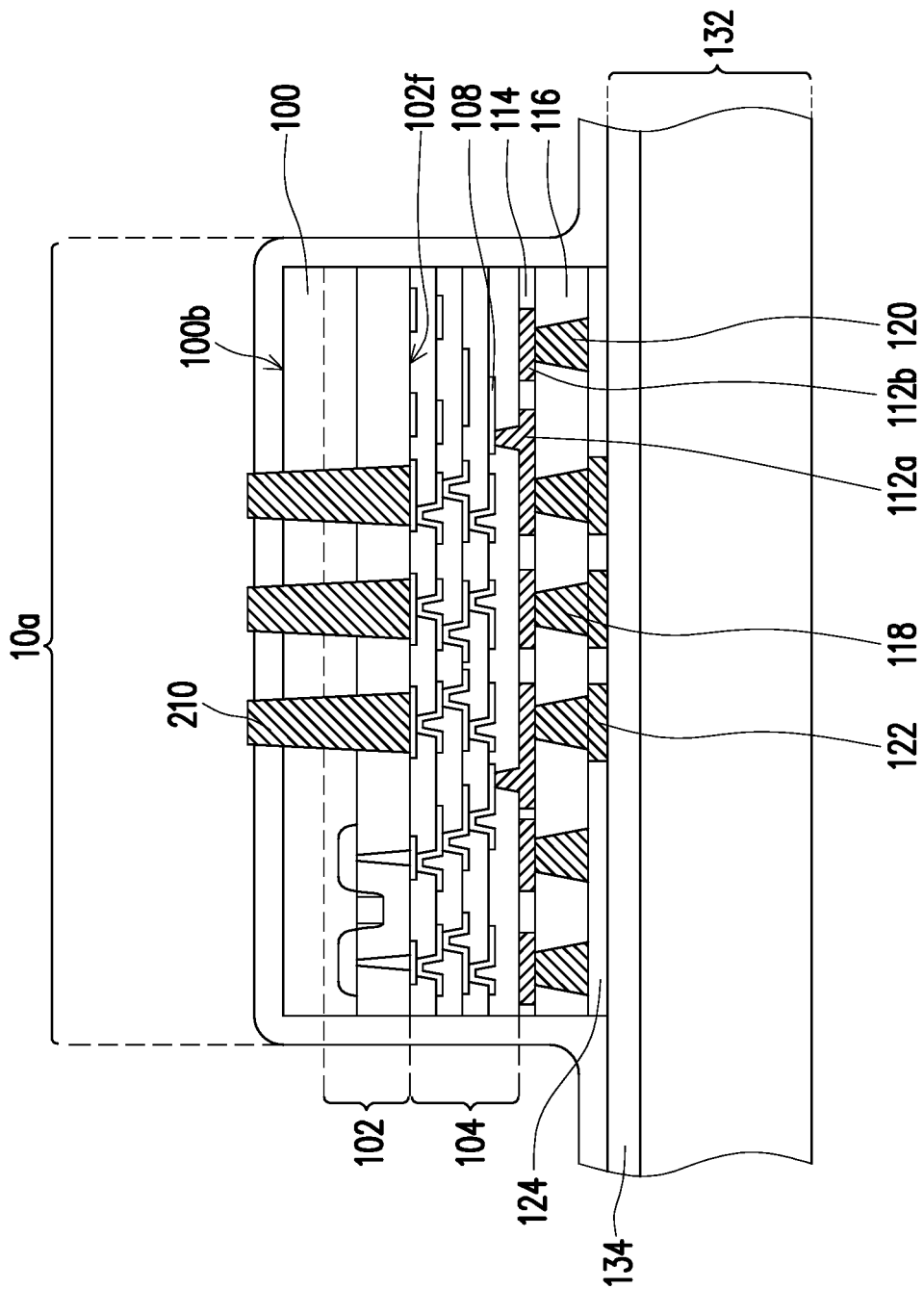
FIG. 3A and FIG. 3B are schematic cross-sectional views illustrating semiconductor structures according to some embodiments of the present disclosure.

FIG. 3A is a schematic cross-sectional view illustrating a semiconductor structure 10a according to some embodiments of the present disclosure. The semiconductor structure 10a as shown in FIG. 3A is similar to the semiconductor structure 10 as shown in FIG. 2J, only differences therebetween will be discussed, the like or the same parts will not be repeated again.

Referring to FIG. 2J and FIG. 3A, a major difference between the semiconductor structure 10a shown in FIG. 3A and the semiconductor structure 10 shown in FIG. 2J lies in that the through substrate vias 210 in the semiconductor structure 10a do not penetrate through the interconnection structure 104. In some embodiments, the through substrate vias 210 extend from a front surface 102f of the device layer 102, which is facing away from the semiconductor substrate 100, to over the back surface 100b of the semiconductor substrate 100. In addition, the through substrate vias 210 may be electrically connected with the conductive pads 112a through the interconnection elements 108 in the interconnection structure 104. In some embodiments, some of the through substrate vias 210 are electrically connected with the active devices and/or passive devices in the device layer 102 by the interconnection elements 108. Furthermore, in some embodiments, the conductive pads 112a are overlapped with the through substrate vias 210, respectively. However, in alternative embodiments (not shown), the conductive pads 112a are not overlapped with the through substrate vias 210. A method for forming the semiconductor structure 10a as shown in FIG. 3A may include applying a TSV middle process, of which the formation of the through substrate vias 210 follows the formation of the device layer 102 but precedes the formation of the interconnection structure 104.

Figure 3B:
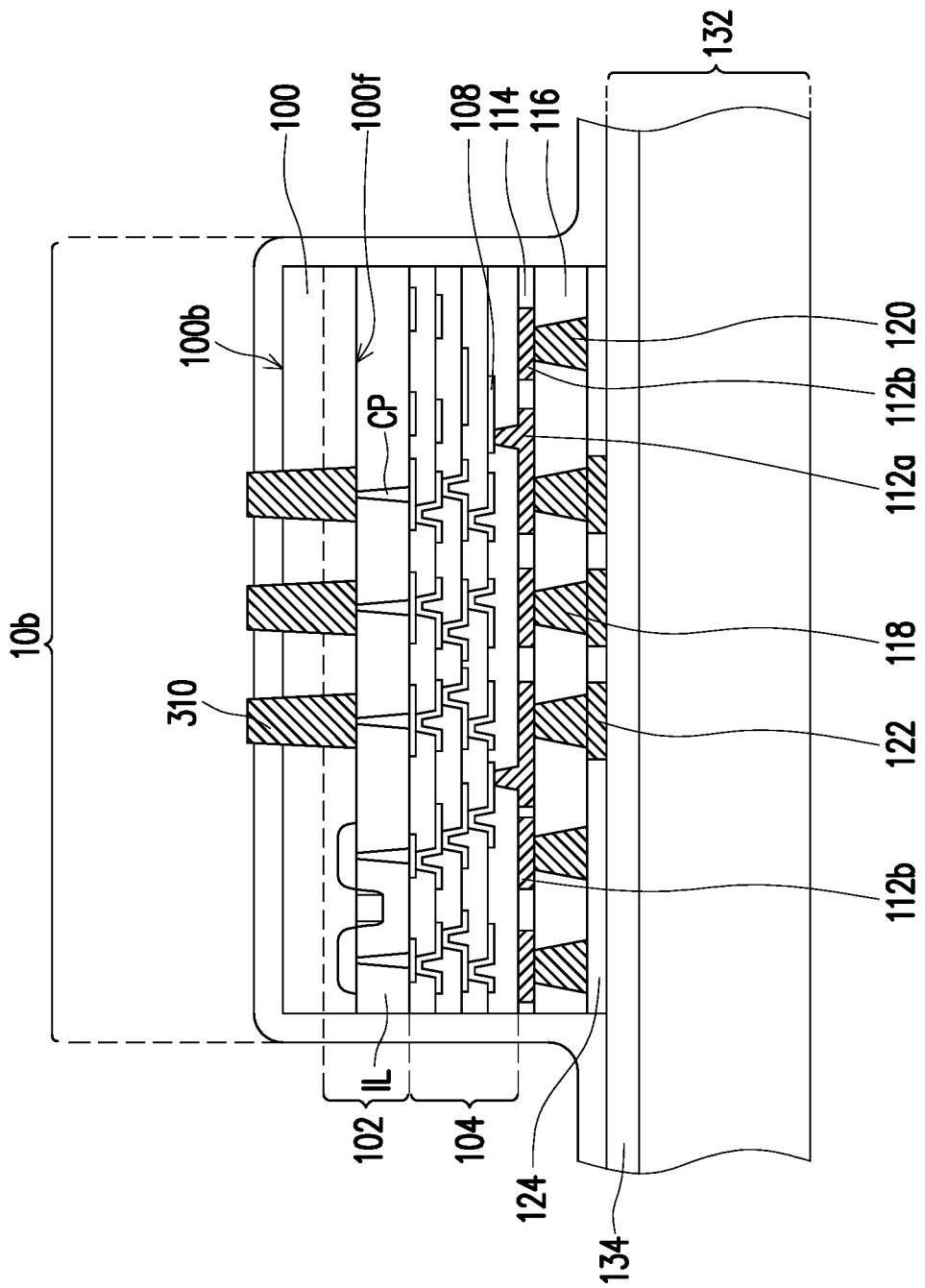

FIG. 3B is a schematic cross-sectional view illustrating a semiconductor structure 10b according to some embodiments of the present disclosure. The semiconductor structure 10b as shown in FIG. 3B is similar to the semiconductor structure 10a as shown in FIG. 3A, only differences therebetween will be discussed, the like or the same parts will not be repeated again.

Referring to FIG. 3A and FIG. 3B, a major difference between the semiconductor structure 10b shown in FIG. 3B and the semiconductor structure 10a shown in FIG. 3A lies in that the through substrate vias 310 in the semiconductor structure 10b do not penetrate through the device layer 102 and the interconnection layer 104. In some embodiments, the through substrate vias 310 extend from a front surface 100f of the semiconductor substrate 100, which is facing toward the interconnection structure 104, to over the back surface 100b of the semiconductor substrate 100. In addition, additional contact plugs CP may be formed in the interlayer dielectric layer IL of the device layer 102 for electrically connecting the through substrate vias 310 to the interconnection elements 108 in the interconnection structure 104. In this way, the through substrate vias 310 are electrically connected to the conductive pads 112a via the additional contact plugs CP and the interconnection elements 108. A method for forming the semiconductor structure 10b as shown in FIG. 3B may include applying a TSV first process, of which the formation of the through substrate vias 310 precedes the formation of the device layer 102 and the interconnection structure 104.

Figure 4A:
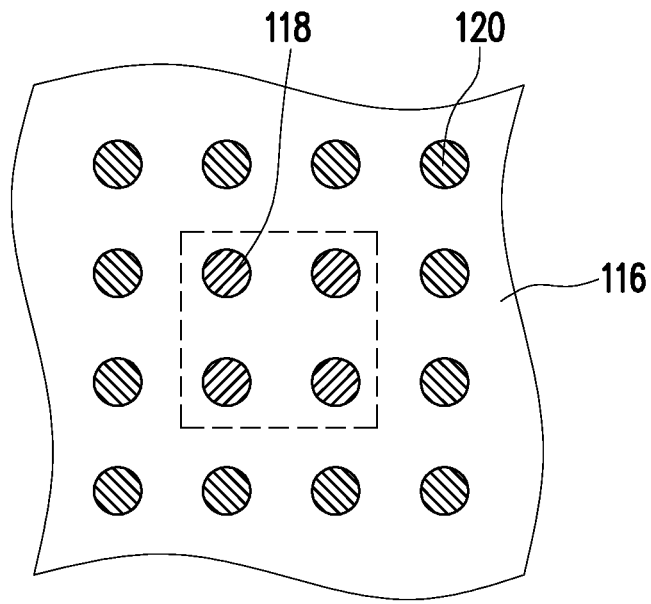
FIG. 4A and FIG. 4B are schematic top views respectively illustrating a configuration of the conductive pillars and the dummy conductive pillars according some embodiments of the present disclosure.

FIG. 4A is a schematic top view illustrating a configuration of the conductive pillars 118 and the dummy conductive pillars 120 according some embodiments of the present disclosure.

Referring to FIG. 4A, the conductive pillars 118 and the dummy conductive pillars 120 are distributed in the insulating layer 116. Each conductive pillar 118 and each dummy conductive pillar 120 may respectively have a circular top view shape. However, those skilled in the art may modify the top view shape of the conductive pillars 118 and the dummy conductive pillars 120 (e.g., to be polygonal), the present disclosure is not limited thereto. In some embodiments, the dummy conductive pillars 120 are laterally separated from one another, and surrounding at least one of the conductive pillars 118. As shown in FIG. 4A, in some embodiments, a group of the conductive pillars 118 enclosed by a dash line (an imaginary line) are surrounded by some of the dummy conductive pillars 120. However, in alternative embodiments, at least one of the dummy conductive pillars 120 may be disposed within a distribution range of a group of the conductive pillars 118 (e.g., the dash line as shown in FIG. 4A). Moreover, in some embodiments, the dummy conductive pillars 118 and the dummy conductive pillars 120 are spaced apart from one another by a substantially constant spacing. In other embodiments, the dummy conductive pillars 118 and the dummy conductive pillars 120 are not evenly distributed in the insulating layer 116.

Figure 4B:
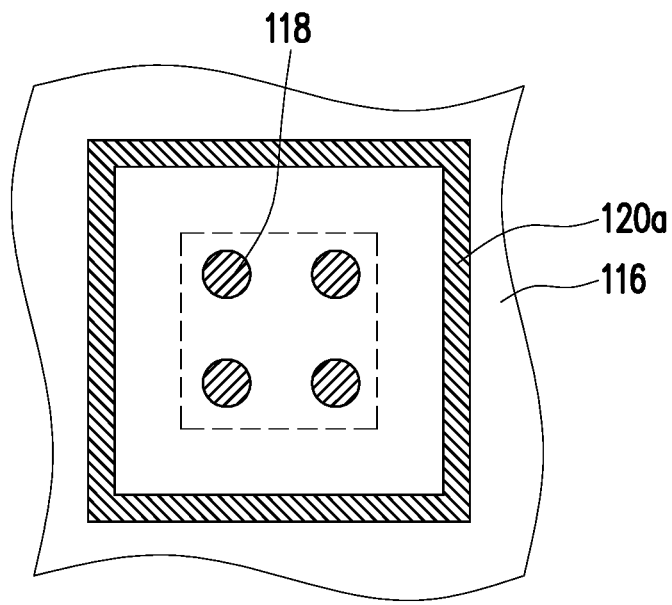

FIG. 4B is a schematic top view illustrating a configuration of the conductive pillars 118 and the dummy conductive pillars 120a according some embodiments of the present disclosure.

Referring to FIG. 4B, in some embodiments, the dummy conductive pillar 120a is formed in a ring shape (e.g., a rectangular ring shape, a circular ring shape or a polygonal ring shape). At least one of the conductive pillars 118 is surrounded by an inner boundary of the ring-shape dummy conductive pillar 120a. For instance, as shown in FIG. 4B, a group of the conductive pillars 118 enclosed by a dash line (an imaginary line) are surrounded by the ring-shape dummy conductive pillars 120a. In addition, in some embodiments, a plurality of the ring-shape dummy conductive pillars 120a are formed in the insulating layer 116, and each of the ring-shape dummy conductive pillars 120a encloses at least one of the conductive pillars 118. In alternative embodiments, substantially all of the conductive pillars 118 are enclosed by a single ring-shape dummy conductive pillar 120a.

As above, as compared to forming electrical connectors (e.g., micro-bumps or the like) at opposite sides of a semiconductor die for interconnecting with other semiconductor dies, the conductive pillars and the bonding pads in the present disclosure are formed at a single side of the semiconductor structure (e.g., a front side of the semiconductor structure). In this way, several process steps including, for example, flipping over a wafer structure and attaching the wafer structure to an additional carrier are no longer required, and formation of the conductive pillars and the bonding pads can be integrated with a back-end-of-line (BEOL) process of the semiconductor structure. Accordingly, a manufacturing cost of the semiconductor structure is reduced. Moreover, in some embodiments, the dummy pads and the dummy conductive pillars are formed along with the conductive pillars at the front side of the semiconductor structure. The dummy pads and the dummy conductive pillars may not participate in signal transmitting, but are able to facilitate heat dissipation of the semiconductor structure. By disposing the dummy conductive pillars, a thermal resistance of the semiconductor structure can be effectively lowered.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In an aspect of the present disclosure, a semiconductor structure is provided. The semiconductor structure comprises: a semiconductor substrate; an interconnection structure, disposed at a front side of the semiconductor substrate, and comprising a stack of dielectric layers and interconnection elements spreading in the stack of dielectric layers; through substrate vias, separately penetrating through the semiconductor substrate and the stack of dielectric layers; conductive pillars, disposed at a front side of the interconnection structure facing away from the semiconductor substrate, and respectively in electrical connection with one of the through substrate vias; and dummy conductive pillars, disposed aside the conductive pillars at the front side of the interconnection structure.

In another aspect of the present disclosure, a semiconductor structure is provided. The semiconductor structure comprises: a semiconductor substrate; an interconnection structure, disposed at a front side of the semiconductor substrate, and comprising a stack of dielectric layers and interconnection elements spreading in the stack of dielectric layers; through substrate vias, separately extending through the semiconductor substrate to a back side of the interconnection structure facing toward the semiconductor substrate, and electrically connected to the interconnection elements in the interconnection structure; conductive pillars, disposed at a front side of the interconnection structure facing away from the back side of the interconnection structure, and respectively in electrical connection with one of the through substrate vias; and dummy conductive pillars, disposed aside the conductive pillars at the front side of the interconnection structure.

In yet another aspect of the present disclosure, a semiconductor structure is provided. The semiconductor structure comprises: a semiconductor substrate; an interconnection structure, disposed at a front side of the semiconductor substrate, and comprising a stack of dielectric layers and interconnection elements spreading in the stack of dielectric layers; through substrate vias, separately extending through the semiconductor substrate, and electrically connected to the interconnection elements in the interconnection structure; conductive pillars, disposed at a front side of the interconnection structure facing away from the semiconductor substrate, and respectively in electrical connection with one of the through substrate vias; and dummy conductive pillars, disposed aside the conductive pillars at the front side of the interconnection structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a semiconductor substrate;
an interconnection structure, disposed at a front side of the semiconductor substrate, and comprising a stack of dielectric layers and interconnection elements spreading in the stack of dielectric layers;
through substrate vias, separately penetrating through the semiconductor substrate and the stack of dielectric layers, and extending to a back side of the semiconductor structure, so as to be engaged with another semiconductor structure;
conductive pillars, disposed at a front side of the interconnection structure facing away from the semiconductor substrate, and respectively in electrical connection with one of the through substrate vias; and
dummy conductive pillars, disposed aside the conductive pillars at the front side of the interconnection structure,
wherein the through substrate vias penetrate completely through all of the dielectric layers between the semiconductor substrate and the conductive pillars.

2. The semiconductor structure according to claim 1, wherein the dummy conductive pillars are electrically isolated from the interconnection elements, the through substrate vias and the conductive pillars.

3. The semiconductor structure according to claim 1, wherein the dummy conductive pillars are formed to a height substantially the same as a height of the conductive pillars.

4. The semiconductor structure according to claim 1, further comprising:
an insulating layer, disposed at the front side of the interconnection structure, and laterally surrounding the conductive pillars and the dummy conductive pillars.

5. The semiconductor structure according to claim 1, further comprising:
bonding pads, respectively covering a front surface of one of the conductive pillars facing away from the interconnection structure, and electrically connected to the conductive pillars, respectively.

6. The semiconductor structure according to claim 5, wherein the dummy conductive pillars are laterally spaced apart and electrically isolated from the bonding pads.

7. The semiconductor structure according to claim 5, further comprising:
a passivation layer, laterally surrounding the bonding pads, and covering front surfaces of the dummy conductive pillars facing away from the interconnection structure.

8. The semiconductor structure according to claim 1, further comprising:
conductive pads, each disposed between and electrically connected to one of the through substrate vias and one of the conductive pillars;
dummy pads, dispose aside the conductive pads and electrically connected to the dummy conductive pillars; and
an additional passivation layer laterally surrounding the conductive pads and the dummy pads.

9. The semiconductor structure according to claim 8, wherein the dummy pads are electrically isolated from the interconnection elements, the through substrate vias and the conductive pillars.

10. The semiconductor structure according to claim 8, wherein the through substrate vias respectively extend to a back surface of one of the conductive pads facing toward the interconnection structure.

11. The semiconductor structure according to claim 1, wherein a group of the conductive pillars are laterally surrounded by separate ones of the dummy conductive pillars.

12. The semiconductor structure according to claim 1, wherein a group of the conductive pillars are laterally surrounded by one of the dummy conductive pillars.

13. The semiconductor structure according to claim 12, wherein the one of the dummy conductive pillars is formed in a ring shape.

14. A semiconductor structure, comprising:
a semiconductor substrate;
an interconnection structure, disposed at a front side of the semiconductor substrate, and comprising a stack of dielectric layers and interconnection elements spreading in the stack of dielectric layers;
through substrate vias, separately extending through the semiconductor substrate to a back side of the interconnection structure facing toward the semiconductor substrate, and electrically connected to the interconnection elements in the interconnection structure, wherein another end of each of the through substrate vias extends to a back side of the semiconductor structure, so as to be engaged with another semiconductor structure;
conductive pillars, disposed at a front side of the interconnection structure facing away from the back side of the interconnection structure, and respectively in electrical connection with one of the through substrate vias;
dummy conductive pillars, disposed aside the conductive pillars at the front side of the interconnection structure;
bonding pads, respectively covering a front surface of one of the conductive pillars facing away from the interconnection structure, and electrically connected to the conductive pillars, respectively; and
a passively layer, laterally surrounding the bonding pads, and covering front surfaces of the dummy conductive pillars facing away from the interconnection structure.

15. The semiconductor structure according to claim 14, wherein conductive pads between the conductive pillars and the interconnection structure are electrically connected to the through substrate vias through the interconnection elements in the interconnection structure.

16. The semiconductor structure according to claim 14, wherein a portion of the interconnection elements spread between the through via structures and the conductive pillars, and are overlapped with the through via structures and the conductive pillars.

17. The semiconductor structure according to claim 14, wherein portions of the through substrate via in contact with the interconnection structure are protruded from the front surface of the semiconductor substrate.

18. A semiconductor structure, comprising:
a semiconductor substrate;
an interconnection structure, disposed at a front side of the semiconductor substrate, and comprising a stack of dielectric layers and interconnection elements spreading in the stack of dielectric layers;
through substrate vias, separately extending through the semiconductor substrate, and electrically connected to the interconnection elements in the interconnection structure;
conductive pillars, disposed at a front side of the interconnection structure facing away from the semiconductor substrate, and respectively in electrical connection with one of the through substrate vias;
dummy conductive pillars, disposed aside the conductive pillars at the front side of the interconnection structure; and
an isolation layer, covering a back side of the semiconductor substrate, wherein a surface of the isolation layer defines a back side of the semiconductor structure, and portions of the through substrate vias protruding with respect to the back side of the semiconductor substrate are laterally surrounded by the isolation layer.

19. The semiconductor structure according to claim 18, wherein the through substrate vias are vertically spaced apart from the interconnection structure.

20. The semiconductor structure according to claim 18, wherein the through substrate vias are electrically connected to the interconnection elements through contact plugs, respectively.

* * * * *